United States Patent
Colby et al.

[19]

[11] Patent Number: 6,127,790
[45] Date of Patent: Oct. 3, 2000

[54] METHOD AND APPARATUS FOR PASSIVELY TRIMMING SAWYER MOTORS TO CORRECT FOR YAW ERRORS

[75] Inventors: Paul C. Colby, Sunnyvale; Ken Q. Mac, San Jose, both of Calif.

[73] Assignee: Electroglas, Inc., Santa Clara, Calif.

[21] Appl. No.: 09/200,423

[22] Filed: Nov. 23, 1998

[51] Int. Cl.[7] .................................................. H02P 7/74
[52] U.S. Cl. ................................................ 318/38; 318/135
[58] Field of Search .......................... 310/72, 112, 189; 318/38, 51, 135

[56] References Cited

U.S. PATENT DOCUMENTS

3,445,749  5/1969  McManus ........................... 310/189 X
4,853,602  8/1989  Hommes et al. ........................ 318/38

*Primary Examiner*—Nestor Ramirez
*Assistant Examiner*—Judson H. Jones
*Attorney, Agent, or Firm*—Blakely, Sokoloff, Taylor & Zafman

[57] ABSTRACT

A system is disclosed for correcting for rotational errors in a linear motor system. A shunt resistor is coupled in parallel with a winding of a phase of a motor of the linear motor system to correct for rotational errors caused by differences in the magnetic characteristics of the motors comprising the linear motor system. Yaw error values for the motors are sequentially measured to determine the value of the shunt resistor, and its location on a winding of a phase motor of the linear motor system.

13 Claims, 9 Drawing Sheets

| Winding | Left Side | Right Side |
|---------|-----------|------------|
| A | + | - |
| B | - | + |
| C | + | - |
| D | - | + |

FIG. 8

FIG. 9

METHOD AND APPARATUS FOR PASSIVELY TRIMMING SAWYER MOTORS TO CORRECT FOR YAW ERRORS

FIELD OF THE INVENTION

The present invention relates to linear motion systems, and more specifically to tuning the magnetic characteristics of Sawyer motors.

BACKGROUND OF THE INVENTION

Linear motion systems are used to accurately position semiconductor wafers during commercial semiconductor fabrication processes and automated assembly of semiconductor devices. One form of a linear motor offering high speed and accuracy is a Sawyer motor.

In a typical semiconductor processing application, a Sawyer motor operates on a steel waffle platen and is floated by a thin layer of air (about 8–13 microns thick) by an air bearing. The Sawyer motor is used to position a semiconductor wafer so that, for example, the die composing the wafer may be tested before packaging. With low mass loads, Sawyer motors are capable of high position resolution (e.g., 2 microns with open loop micro-step control), rapid acceleration (e.g., 1 g), and high speed movement (e.g., 1.5 m/sec).

In many applications, Sawyer motors that are built to identical specifications actually vary in their performance characteristics. A common cause of these variations is due to errors or variations in the manufacture of these motors. Manufacturing variations include variations in magnetic materials used in fabricating Sawyer motors, and manufacturing variations which cause inaccuracies in motor geometry. If manufacturing variations are large enough, a Sawyer motor may perform out of nominal specification. Since Sawyer motors operate mostly in an open-loop mode, use of motors which perform out of nominal operating specification in a linear positioning system can lead to positional inaccuracies in the system. For example, when a single Sawyer motor that is out of specification, travels in a linear direction (e.g., an X direction), it may travel an inaccurate distance for any given drive current. At the end of a full drive cycle, the motor may have traveled the correct total distance. However, during the drive cycle the motor may not have been at the correct linear position at any given instant of time within the drive cycle. If the motor is stopped at a partial cycle, the motor's position may deviate from the intended position. This type of inaccuracy is called a translational inaccuracy.

Translational inaccuracies can manifest themselves as rotational errors when two Sawyer motors are configured in a side-by-side assembly, and the assembly is made to travel in some linear direction. For example, if the two Sawyer motors of the above assembly have mismatched performance characteristics relative to each other, and are driven by the same current source, one motor will tend to travel a greater distance than the other. As a result, the assembly will tend to rotate during a current drive cycle (typically one sinusoidal period), about the Z axis perpendicular to the XY plane of linear motion.

Given the above motor assembly, if the rotation angle were zero at the beginning of a full drive cycle, then at the end of a full drive cycle the motor assembly may again be at a zero rotation angle. However, during the drive cycle, if the motor assembly is stopped at some partial cycle the motor assembly may have rotated some absolute angle about the Z axis. Such a rotational angle about the Z axis is known as a yaw angle.

If, however, both Sawyer motors in the motor assembly are identical and without an impedance mismatch, then they will move in a straight line on the XY plane during the drive cycle. Consequently, the motor assembly will not experience a significant yaw rotation error at any time during the drive cycle.

Present methods of correcting for positional errors in Sawyer motors that are used in a side-by-side motor assembly often requires reworking the Sawyer motor itself by regrinding the motor's pole face surface. In general, regrinding Sawyer motors is both time consuming and costly. Furthermore, the regrinding process often results in low yields of Sawyer motors corrected to operate within performance parameters. Consequently, in many precision applications requiring tight tolerances, a significant percentage of Sawyer motors may be scrapped as unusable.

SUMMARY OF THE INVENTION

It is an intended advantage of embodiments of the present invention to provide a method of adjusting for inaccuracies in a Sawyer motor assembly, without extensively reworking the motor.

It is a further intended advantage of embodiments of the present invention to provide a low cost and simple method of correcting for mismatched performance between side-by-side Sawyer motors in a Sawyer motor assembly.

The present invention discloses an apparatus that includes a motor having a shunt coupled in parallel with a winding of the motor. In one embodiment of the present invention, a shunt resistor is coupled in parallel with a winding of a phase of a Sawyer motor assembly. Both the value of the shunt resistor, and its location on a winding of a phase determine the amount of rotation angle adjustment the shunt provides.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

In the following description, numerous specific details are set forth for purposes of example, such as methods to measure rotational angle, specific attachment locations of shunt resistors and specific values for shunt resistors. It will be apparent however, to one of ordinary skill in the art that the present invention may be practiced without these specific details. In other instances, well-known motor operating principles such as magnetic flux flow in a Sawyer motor which causes its movement, have been omitted or have not been shown in detail in order to avoid obscuring the present invention.

A method and apparatus is disclosed for correcting rotational errors caused by inaccuracies in operating performance in a Sawyer motor assembly, without requiring extensive reworking of the motor. In one embodiment of the present invention, a shunt resistor is coupled in parallel with a winding of a phase of a Sawyer motor assembly. Both the value of the shunt resistor, and its location on a winding of a phase determine the amount of rotation angle adjustment the shunt provides.

Methods of the present invention may employ one or more mathematical algorithms and/or processes. In one embodiment of the present invention, the mathematical algorithms are processed using a general purpose computer, such as a personal computer. However, these algorithms could also be processed in a dedicated hardware circuit such as, for example, an application specific integrated circuit (ASIC), or other similar circuitry.

Semiconductor processing equipment often employ Sawyer motor assemblies to position and process the semiconductor wafers. A general Sawyer motor assembly consists of two motors, each having two phases and each phase having a winding. The Sawyer motor assembly typically operates on a platen that comprises raised and depressed surfaces in a waffle pattern. The poles of the Sawyer motor magnetically interact with the platen surface to step across the platen in correspondance with the distances between these surfaces. The Sawyer motor is an electromagnetic device that is driven by a drive current that activates the magnetic poles of the motor. The combination of a platen and a Sawyer motor assembly is known as a Sawyer linear motion system. For Sawyer motor assemblies that comprise two or more Sawyer motors arranged in a series-fed arrangement, yaw angle induced positional errors may occur if the performance specifications of the motors are not matched closely enough to one another.

Figure 1:
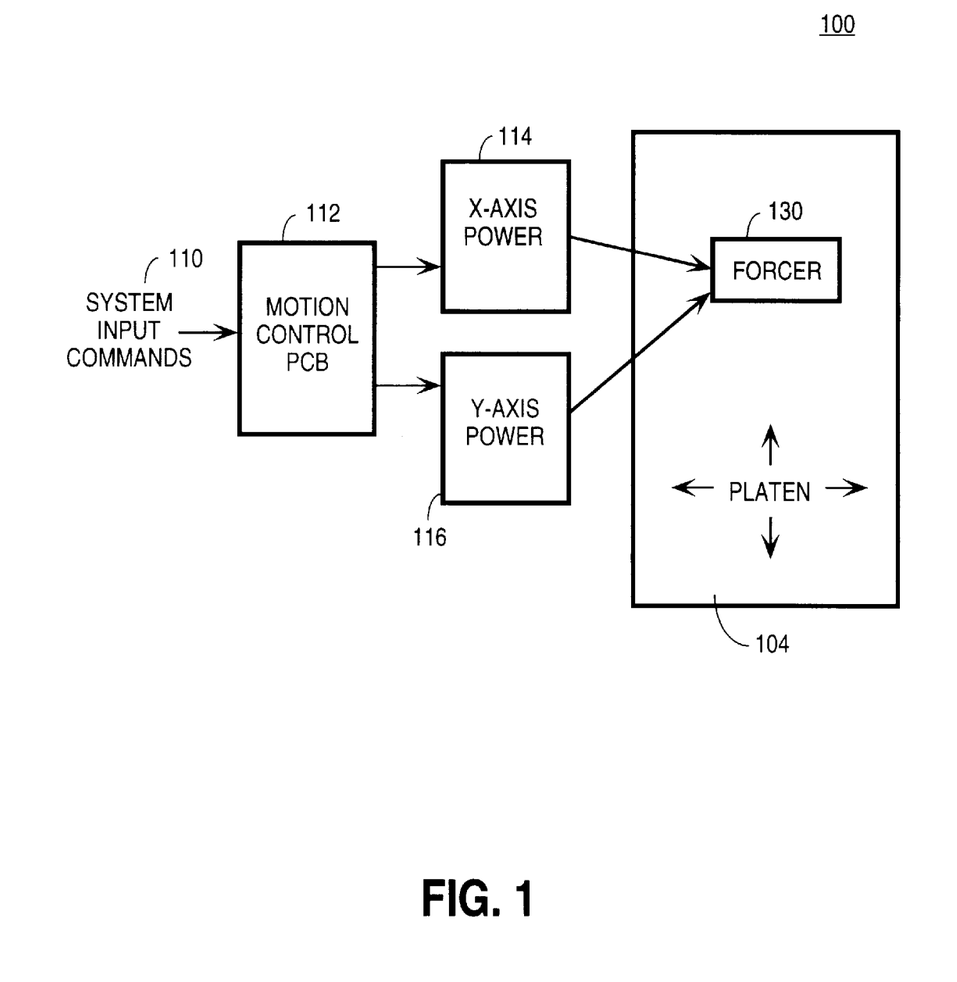
FIG. 1 illustrates a diagram of a linear motion system that is used with embodiments of the present invention.

FIG. 1 is a block diagram of a Sawyer linear motor system 100, that implements embodiments of the present invention. In response to system input commands 110, a motion control printed circuit board (PCB) controller 112 directs X-axis and Y-axis positioning drive currents to forcer 130. The positioning drive currents are supplied by X-axis power controller 114 and Y-axis power controller 116. Forcer 130 receives the drive current controls and moves in either an X or Y direction over platen 104.

In one embodiment, linear motion system 100 is used in a conjunction with a processing system that serves as a controller for a semiconductor wafer probing device that performs electrical tests on integrated circuits (die) within a wafer. The probing device includes such as motors for the movement of the wafer and probe heads, as well as imaging equipment for capturing graphical images of the die in a wafer. Such a processing system is manufactured by Electroglas, Inc. of Santa Clara, Calif. In one embodiment of the present invention, movement of the wafer is controlled by a motor unit that comprises two or more Sawyer motors arranged in a series-fed arrangement.

Figure 2:
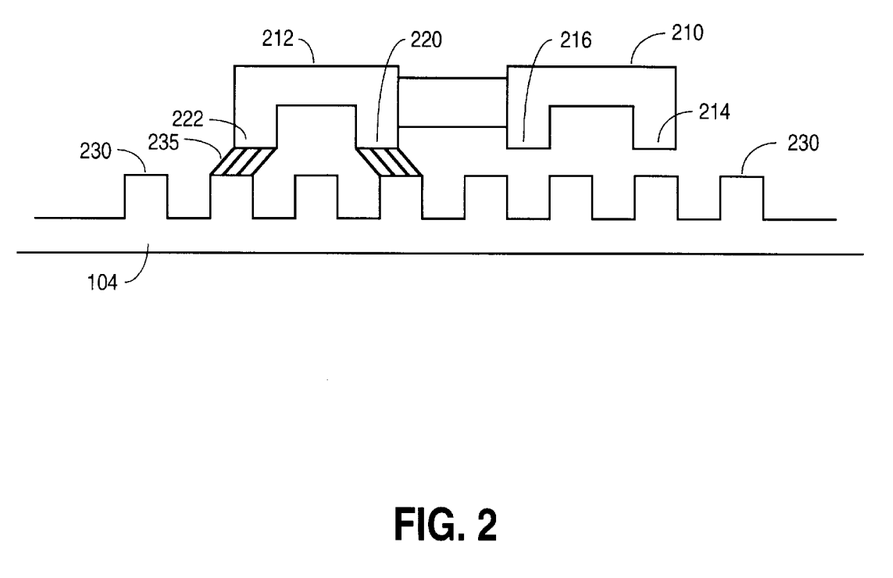
FIG. 2 illustrates exemplary phases of a Sawyer motor as it is positioned over a platen for the linear motion system illustrated in FIG. 1.

FIG. 2 is a side-view illustration of a two-phase Sawyer motor as it travels over a platen, according to one embodiment of the present invention. In FIG. 2, the mechanical relationship between the motor phases 210 and 212 of the Sawyer motor relative to platen 104 is illustrated. In typical applications, pole faces 214, 216, 220 and 222 are all machined faces of motor phases which are designed to magnetically align in a critical fashion with mechanically formed platen faces 230. Any misalignment of pole faces 214, 216, 220 and 222 to platen faces 230, will cause the magnetic flux lines 235 to be disturbed from their designed nominal tolerances. The magnetic flux lines control the motion of, for example, forcer 130. If the magnetic flux lines are disturbed because of machining inaccuracies, the motion of the Sawyer motor assembly will be disturbed from its designed nominal motion for a given drive current value.

In one embodiment of the present invention, machining inaccuracies, which cause disturbances of the magnetic flux lines, are adjusted towards a nominal flux by use of a shunt resistor connecting between windings of one or more phases of the Sawyer motor. Use of a shunt resistor also compensates for other manufacturing variations which affect magnetic flux, such as variations in the magnetic permeability of materials used in fabricating the motor phases.

Figure 3:
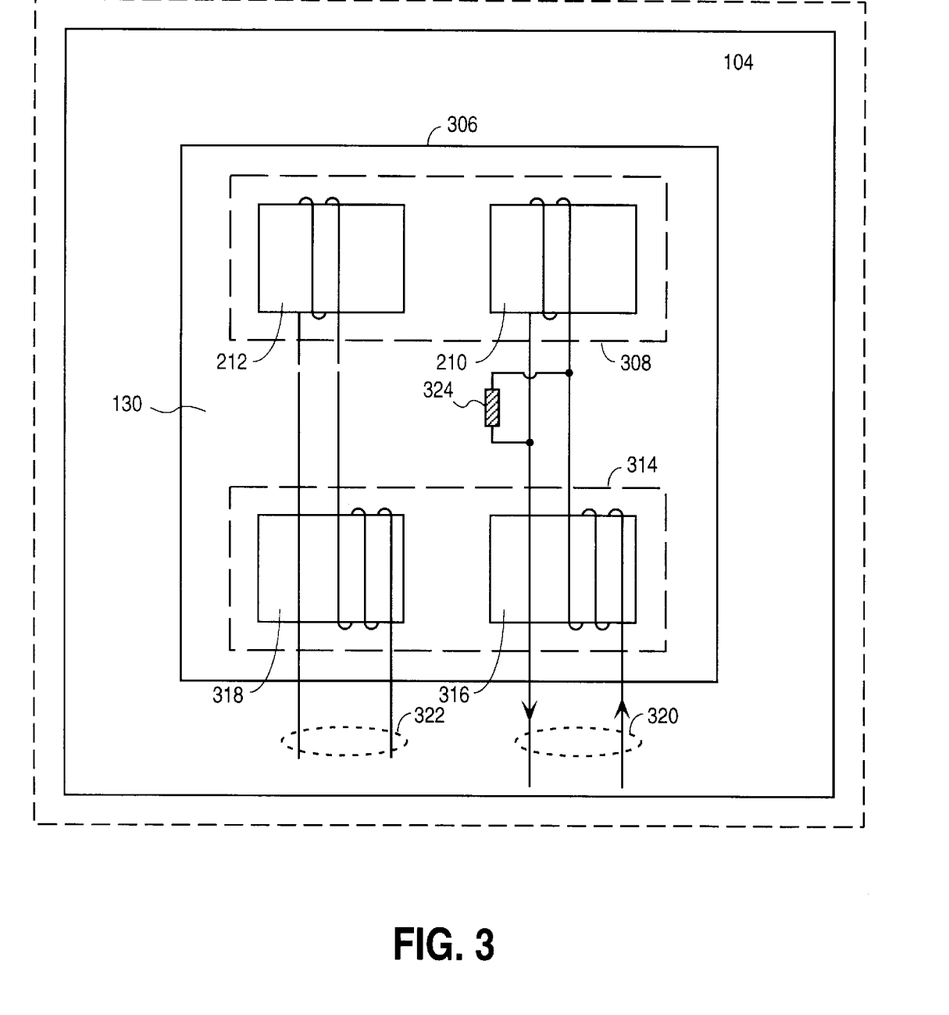
FIG. 3 is a diagram of a Sawyer linear motor system having a shunt circuit, according to one embodiment of the present invention.

FIG. 3 illustrates a Sawyer linear motor system 300, according to one embodiment of the present invention, which is made up of a combination of platen 104 and Sawyer motor assembly 306. Sawyer motor assembly 306 consists of a first Sawyer motor 308, and a second Sawyer motor 314 both coupled to a forcer plate 130. First Sawyer motor 308 consists of an A phase 210, which has winding 320, and a B phase 212 which has winding 322.

The second Sawyer motor assembly 314 consists of an A phase 316 with winding 320, and a B phase 318 with winding 322. It is to be noted that since winding 320 is common to both A phase 210 of the first Sawyer motor and A phase 316 of the second Sawyer motor, the same drive current controls the motion of both phases. Similarly, winding 322 is common to both B phase 212 of the first Sawyer motor and B phase 318 of the second Sawyer motor, and therefore the same drive current controls the motion of both phases.

In one embodiment to the present invention, a shunt resistor is coupled between windings for one phase of the Sawyer motor assembly 306. As illustrated in FIG. 3, shunt resistor 324 is coupled in parallel with A phase 210 of Sawyer motor 308. In this position, shunt 324 removes drive current from A phase 210 without affecting the amount of current flowing through A phase 316.

In one embodiment of the present invention, shunt resistor 324 is a passive resistor, such as a ¼ watt 10 ohm resistor coupled between the winding wires of a phase of the Sawyer motor. Although FIG. 3 illustrates the location of shunt resistor 324 as affixed across winding 320, it should be noted that the actual location of the shunt resistor may vary depending on the performance deviation between the two Sawyer motors 308 and 314. The determination of the optimum location and value for the shunt resistor will be described in greater detail in the discussion that follows.

In an alternative embodiment of the present invention, shunt circuit 324 is an active component such as a semiconductor device that adds impedance between the windings of the Sawyer in a non-linear manner.

FIG. 3 illustrates a two-phase Sawyer linear motor system that is tuned in accordance with an embodiment of the present invention. A two-phase motor system includes 2 phases and 2 windings and moves only in one axis. For this embodiment, the two motors, 308, and 314 are operable to move the forcer only in one direction (e.g., the X-direction). However it is to be noted that embodiments of the present invention can also be implemented with four-phase motor systems that include additional Sawyer motors to move the forcer in a Y direction.

Figure 4:
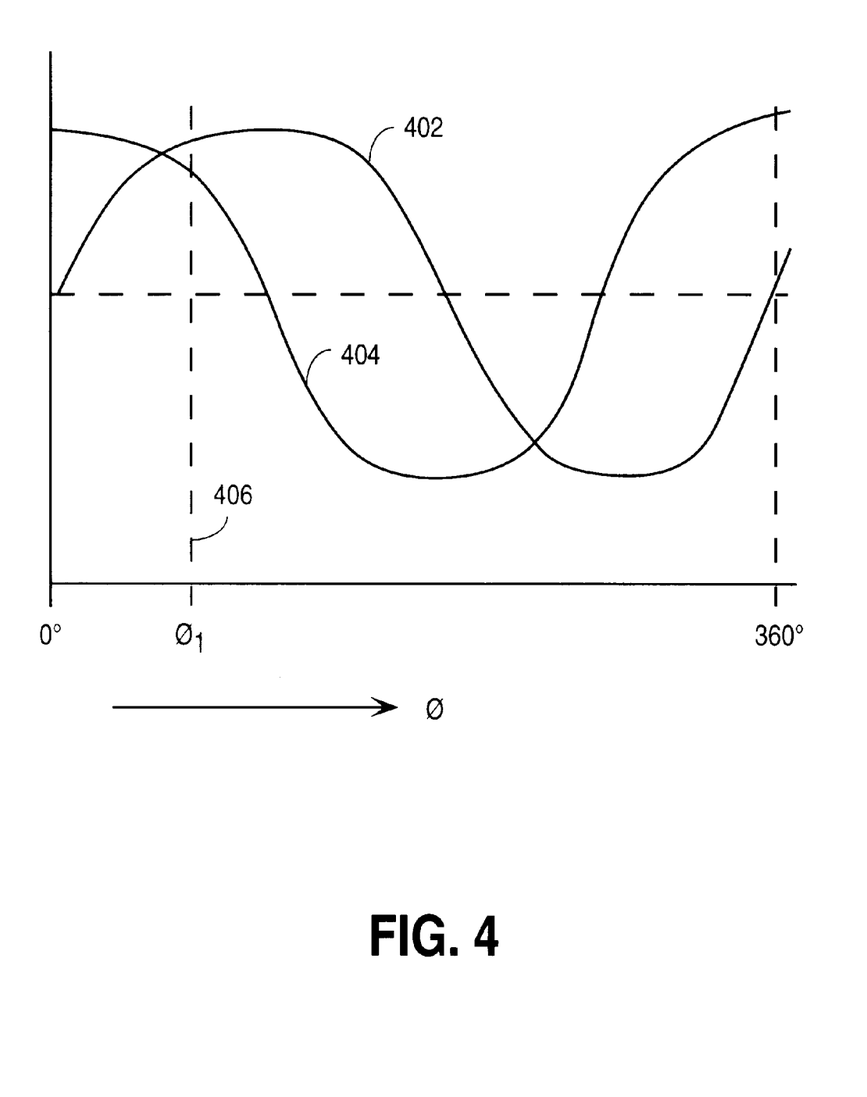
FIG. 4 illustrates current signals used to drive a Sawyer motor assembly, according to one embodiment of the present invention.

FIG. 4 illustrates an example of current drive signals used to drive the A and B phases of Sawyer motors 308 and 314 illustrated in FIG. 4. In one embodiment of the present invention, A phase 210 and A phase 316 of Sawyer motor assembly 306 are simultaneously driven by the sine wave drive current of signal 402 of FIG. 4. Likewise, the B phase 212 and B phase 318 of the Sawyer motor assembly 306, are then simultaneously driven by cosine signal 404 of FIG. 4. The magnitude and frequency of cosine signal 404 is identical to sine signal 402, but shifted 90 degrees.

As both sine signal 402, and cosine signal 404 move towards 360 degrees from the beginning of their period at zero degrees, the motor assembly 306 will move a plus or minus X direction, where the direction of movement depends upon the polarity of the sin/cos signal when the drive current begins to drive the motor phases A and B of the Sawyer motor assembly 306.

Figure 5A:
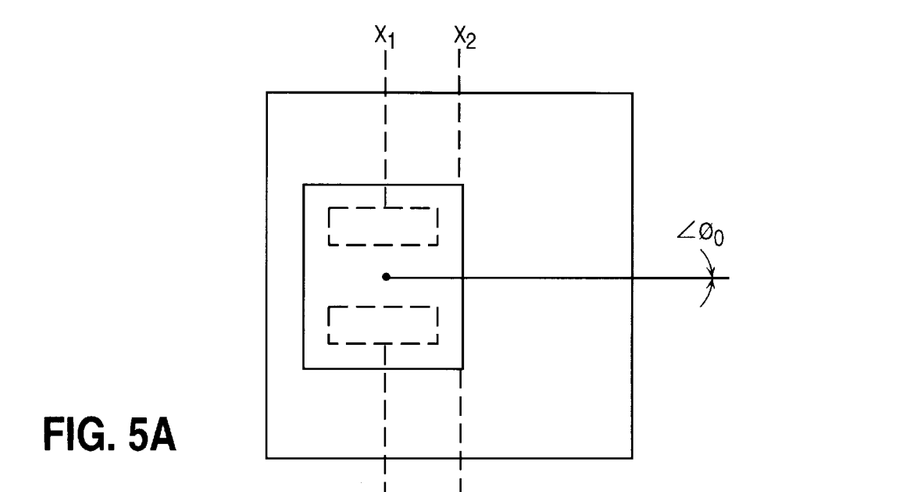
FIG. 5A illustrates a Sawyer motor assembly at a first position on a platen, according to one embodiment of the present invention.
Figure 5B:
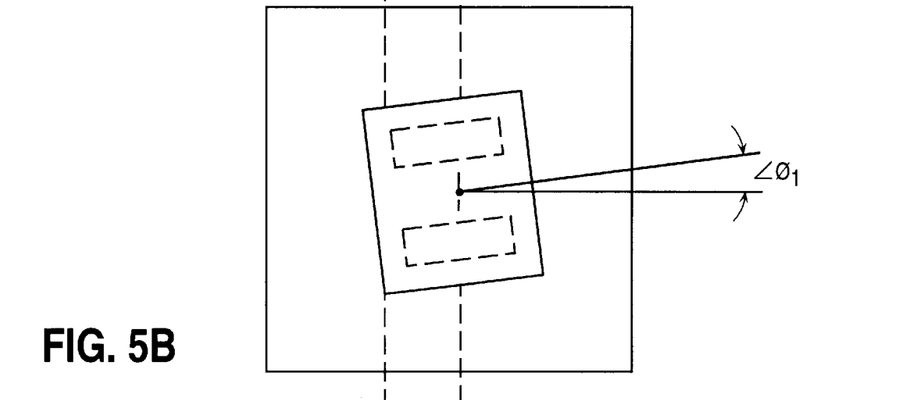
FIG. 5B illustrates a Sawyer motor assembly at a second position on a platen, according to one embodiment of the present invention.

In one drive current operation, the motor assembly moves in a +X direction. For purposes of example, FIG. 5A illustrates the orientation of the motor assembly at an initial position, and FIG. 5B illustrates the rotational angle of motor assembly 306 after being driven for a period of time. FIG. 5B illustrates a yaw error that occurs in the case in which shunt resistor 324 is not connected, and Sawyer motor 308 and Sawyer motor 314 operating performance is mismatched.

Figure 5C:
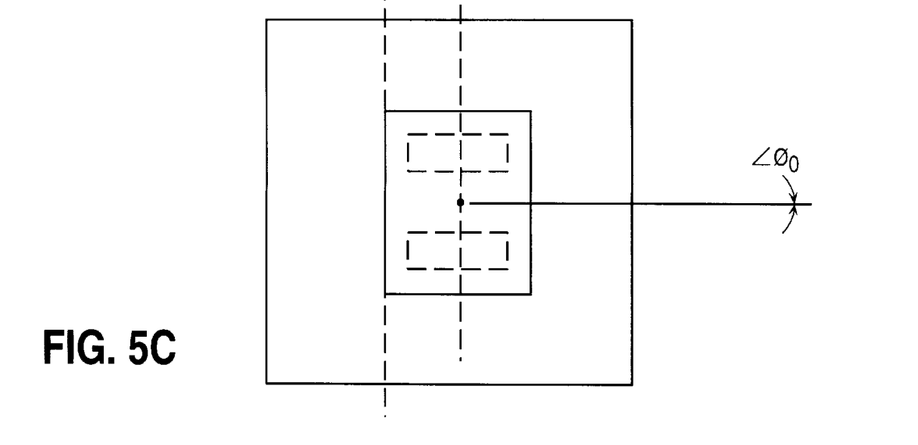
FIG. 5C illustrates a Sawyer motor assembly at a third position on a platen, according to one embodiment of the present invention.

As the motor drive current proceeds from zero degrees to some phase angle, $\emptyset_1$, which is less than 180 degrees as shown by angle $\emptyset_1$ 406 of FIG. 4, the motor assembly moves from position X1 of FIG. 5A in a +X direction, to position X2 as shown in FIG. 5B. However, with a baseline Sawyer motor 306 (i.e. a Sawyer motor without shunt 324), some rotation angle may occur as shown by angle $theta_1$ in FIG. 5B. If the drive current is held at a DC current level at the instant the drive signals reach angle $\emptyset_1$ of FIG. 4, Sawyer motor 308 and 314 stop their respective translation in the X direction. At this point, both the X direction translation and the rotation of motor assembly 306 stops at angle $theta_1$, and an absolute rotation error occurs as shown by the offset angle, $theta_1$, in FIG. 5B. The rotation of motor assembly 306, which occurs about the Z axis perpendicular to the XY plane of platen 104 and motor assembly 306, represents a yaw rotational error. As sine signal 402 and cosine signal 404 proceed through a full period (i.e., a period from zero to 360 degrees), both a baseline Sawyer motor 306 and a Sawyer motor 306 with a shunt, will return to a zero or approximately zero rotation angle as shown by FIG. 5C.

In the above example, it is assumed that there is a difference in performance between Sawyer motor 308 and 314 that causes Sawyer motor 308 to travel a shorter distance in the positive X direction than Sawyer motor 314. The difference in the distance traveled in a linear direction (e.g., in the X-direction) between the two Sawyer motors 308 and 314, is known as a translational mismatch. Because of the translation mismatch of this example between the two Sawyer motors, assembly 306 yaws counter-clockwise. A zero yaw angle is considered ideal. In one embodiment of the present invention, yaw adjustment is accomplished by attaching a shunt resistor in parallel with one or more windings a motor phase, as illustrated in FIG. 3.

Figure 6:
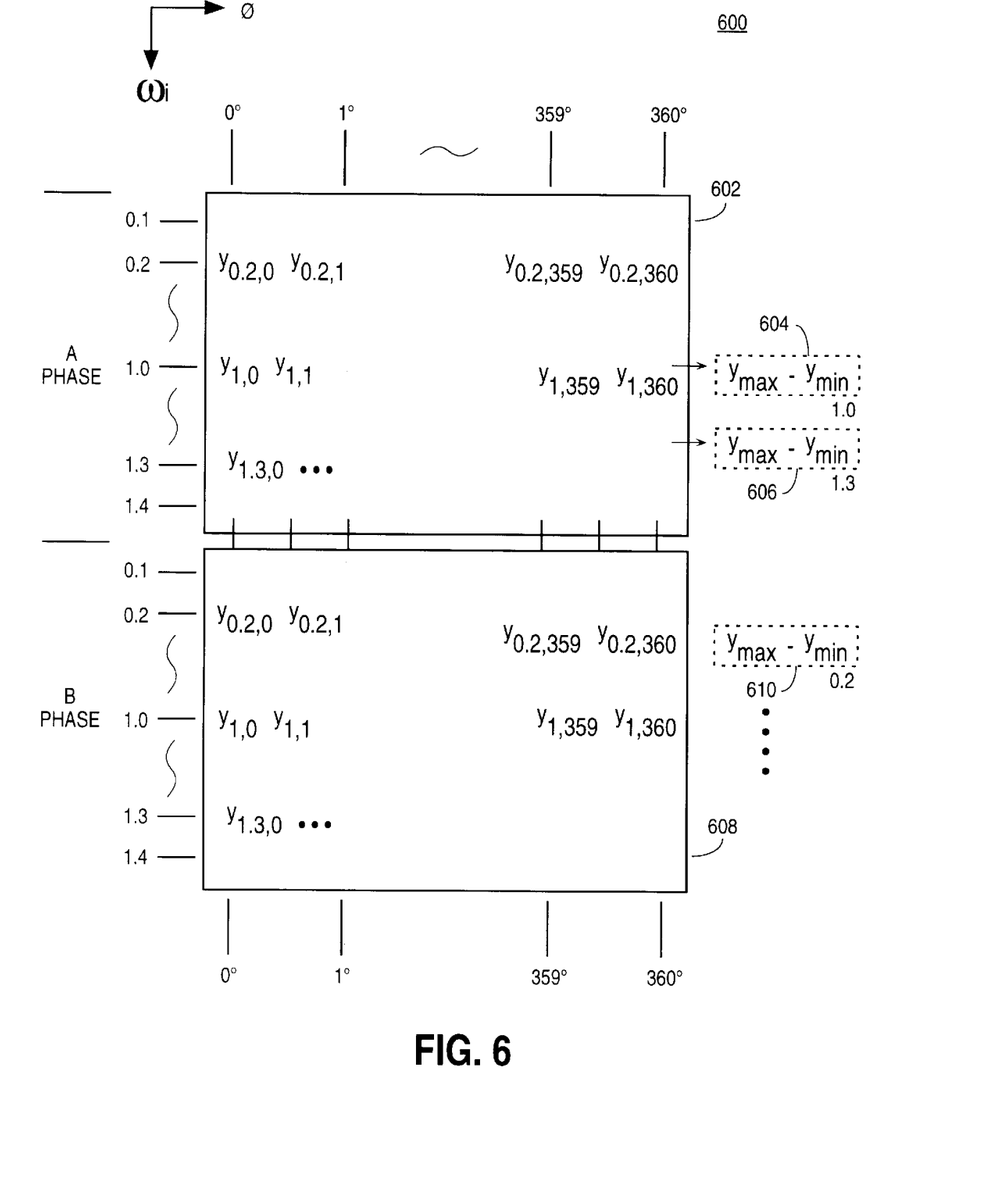
FIG. 6 illustrates a yaw angle profile matrix for a Sawyer motor assembly, according to one embodiment of the present invention.

Both the value of the shunt and the identification of the phase winding a shunt is attached to, are specifically determined by embodiments of the present invention. In one embodiment of the present invention, the shunt value and attachment location are derived from a rotational (i.e., yaw) angle matrix. FIG. 6 illustrates a yaw angle matrix that is used to determine the value and location of a shunt resistor for a Sawyer motor assembly, according to one embodiment of the present invention. Yaw angle matrix 600 in FIG. 6 comprises two sub-matrices 602 and 608, each corresponding to a different phase of the Sawyer motor assembly. In yaw angle sub-matrices 602 and 608, each value of yaw angle YRi is either a measured or a calculated value reflecting a shunt modified yaw angle of Sawyer motor assembly 306.

The discussion of FIG. 6 is made with reference to the Sawyer motor assembly illustrated in FIG. 3. It should be noted that the composition of yaw angle matrices according to embodiments of the present invention will vary depending on the structure and characteristics of the Sawyer motor assembly. The yaw angle matrix of FIG. 6 is divided into columns ranging from zero to 360 degrees with increments of one degree, and rows ranging across 14 values of a variable angle, $\omega_1$. In one embodiment of the present invention, the yaw angle matrix 600 is created by first measuring yaw angle profiles based on Sawyer motor assembly 306 without and with a shunt resistor, and second, calculating yaw angles YRi for yaw angles YRi not measured, for each phase of Sawyer motors 308 and 314.

A yaw angle profile is a set of yaw angle measurements, taken of the absolute yaw angle of Sawyer motor assembly 306, as it moves in a linear direction driven through a full period of sine signal 402 and cosine signal 404 of FIG. 4. The absolute yaw angle is the yaw angle relative to zero degrees yaw, where zero degrees yaw is an angle parallel to the direction of linear motion.

At a minimum, two measured yaw angle profiles are required to create a yaw angle matrix. These two yaw angle profiles establish the measured yaw profile of Sawyer motor assembly 306, from which all other profiles of a Sawyer motor's yaw performance, for a given set of shunt resistor values, can be calculated. Typically, the first yaw angle profile, known as a baseline yaw angle profile, is taken of baseline Sawyer motor assembly 306 without a test shunt resistor, and a second yaw angle profile is taken of Sawyer motor assembly 306 with a test shunt resistor connected. The test shunt resistor is connected in parallel to the winding of a motor phase, typically A phase 210, but it may be attached in parallel to any winding.

In one embodiment of the present invention, the test shunt resistor used in measuring the yaw angle profile is selected to be a fixed value, such as 10 ohms. However, the test shunt can be any value as determined by the following averaging formula:

$$Rtest = (1/i)\sum_i^1 Ri$$

It is to be of noted that during the measurement portion of determining the yaw angle matrix, an actual test resistor is connected to a motor phase winding. However, during the calculated portion of creating a yaw matrix, only the value of the test resistor is used as a mathematical constant number Rt, while the value of Ri iterates.

In one embodiment of the present invention, a number of resistor values is tested to determine the the optimum value. For example, the number of resistor values Ri may be selected to be 14. In this case, the absolute values of the resistors are typically set such that $\omega_1$ will vary from 0.1 to 1.4, in increments of 0.1, where $\omega_1$ equals:

$$\omega_1 = Rt/Ri$$

Although the number of resistor values Ri shown above is 14, it should be appreciated that the values of Rt, Ri, and $\omega_1$ are not absolute and may vary depending upon the selection of the values of the resistors in the set of Ri as i goes from 1 to a maximum value. Also, the selection of resistors may vary depending upon the range of yaw angle adjustment sought for Sawyer motor 306.

Once the two yaw profiles above are measured, the balance of the $Y_{rn}$ matrix values are calculated by the following equation:

$$Y_{Ri} = Y_{BL}^{(\emptyset)} + 10/_{Ri}(Y_{10\,ohm}^{(\emptyset)} - Y_{BL}))$$

In the above equation, $Y_{ri}$ is the calculated yaw angle (for any $Y_{ri}$ not measured) for any given resistor shunt value where Ri goes from $R_1$ to Ri.

$Y_{BL}^{(\emptyset)}$ is the measured baseline yaw angle of a Sawyer motor assembly 306 without a test shunt resistor installed, and $10/_{Ri}\omega_1 = Rt/Ri$, where Rt is typically a 10 ohm value, and Ri iterates through the selected resistor values as the $Y_{ri}$ yaw angles are calculated.

Also, in the above equation, $Y_{10\,ohm}^{(\emptyset)}$ is the measured baseline yaw angle with a 10 ohm test shunt resistor connected to a phase of a Sawyer motor assembly 306.

To determine the value of the shunt resistor and the identification of the phase winding that the shunt should be connected to, the $Y_{ri}$ values for at least one phase of Sawyer motor assembly 306 must be calculated. Once the Yri values are calculated for a phase, for example phase 210, a set of "Ymax-Ymin" yaw error values ($Y_{\omega i}$ yaw error values) are determined.

To determine the value of the test shunt resistor, the minimum value of $Y_{\omega i}$ yaw error values is located. This $Y_{\omega i}$ yaw error value corresponds to a resistor position $\omega_i$ in the yaw angle matrix, and therefore to a resistor value used to either measure or calculate a set of $Y_{ri}$ values. For example, if $Y_{\omega i}$ yaw error 604 corresponded to a $\omega_i$ value of 1, then shunt resistor (Rshunt) value would be (1.0=10/Rshunt). In this case, the value of Rshunt would be equal to 10 ohms, which is the same value as the test shunt resistor of 10 ohms. Alternately, if, $Y_{\omega i}$ yaw error 606 yielded the lowest $Y_{\omega i}$ yaw error value, then the shunt resistor value would be (1.4=10/Rshunt), and Rshunt would be approximately 7.14 ohms.

With only one phase location having its $Y_{ri}$ values calculated, the location of the phase windings to which the shunt resistor is connected is straightforward. In the example described above, it was phase 210. However, the location the phase winding to which a shunt resistor is connected, is generally determined by relating the minimum $Y_{\omega i}$ yaw error value back to a corresponding $\omega_i$ location. From there the value of the shunt resistor corresponds to the $\omega_i$ value, and the phase location of $\omega_i$ corresponds to the phase receiving the shunt resistor.

Figure 8:
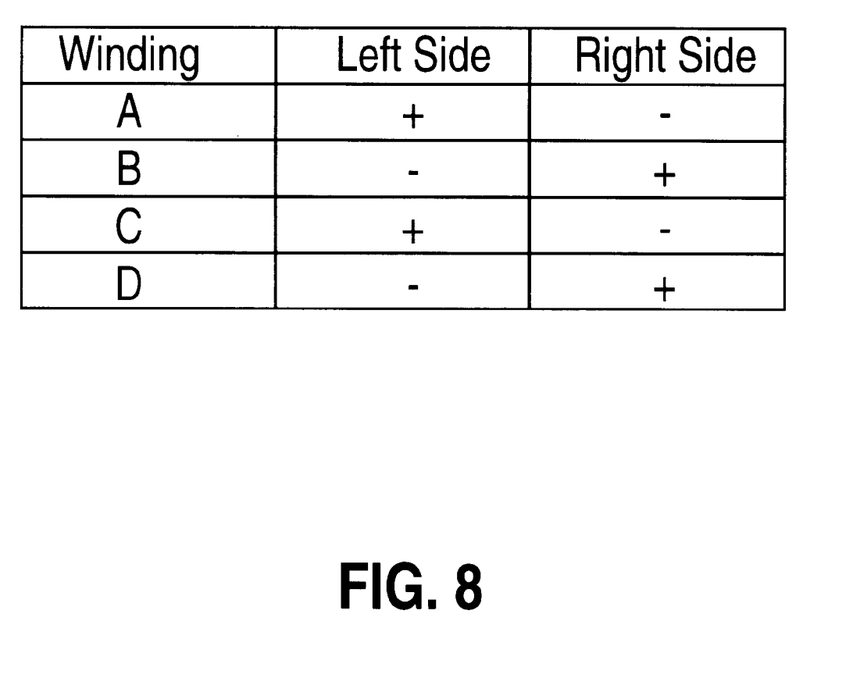
FIG. 8 is a table of polarities associated with the rotational effect of the placement of a shunt resistor on a motor phase, according to one embodiment of the present invention.

However, the effect of the shunt resistor is both equal in its effect and possibly inverted in sign, depending upon the phase location to which a shunt is connected. FIG. 8 is a table of polarities associated with the rotational effect of the placement of a shunt resistor on a motor phase, according to one embodiment of the present invention. For the example above, the yaw matrix for phase 210, which in FIG. 8 corresponds to phase winding A, of the left side Sawyer motor 308 was calculated. Alternatively, according to table 800 of FIG. 8 one could attach the same value of the shunt resistor to the B phase of the right side corresponding to phase 318 of FIG. 3. According to table 800, a shunt resistor connected to the winding of B phase 318, will create the same effect as a shunt attached to the winding of A phase 210.

In the above example, only one yaw angle matrix was filled in for a test shunted A phase 210. However, it will be appreciated by one of ordinary skill in the art that a test shunted yaw angle profile may be measured for each phase of all motors contained within a Sawyer motor system. In the case of the two phase motor of Sawyer motor system 306, four yaw phase profiles could be measured for each phase winding. If additional Sawyer motor assemblies were added to help drive the X forcer 130, then eight total test shunted yaw angle profiles would be measured. Additionally, it should be noted that an additional four test shunt profile measurements would be required if a two-phase Sawyer motor assembly were added to drive forcer 130 in the Y direction.

Figure 7:
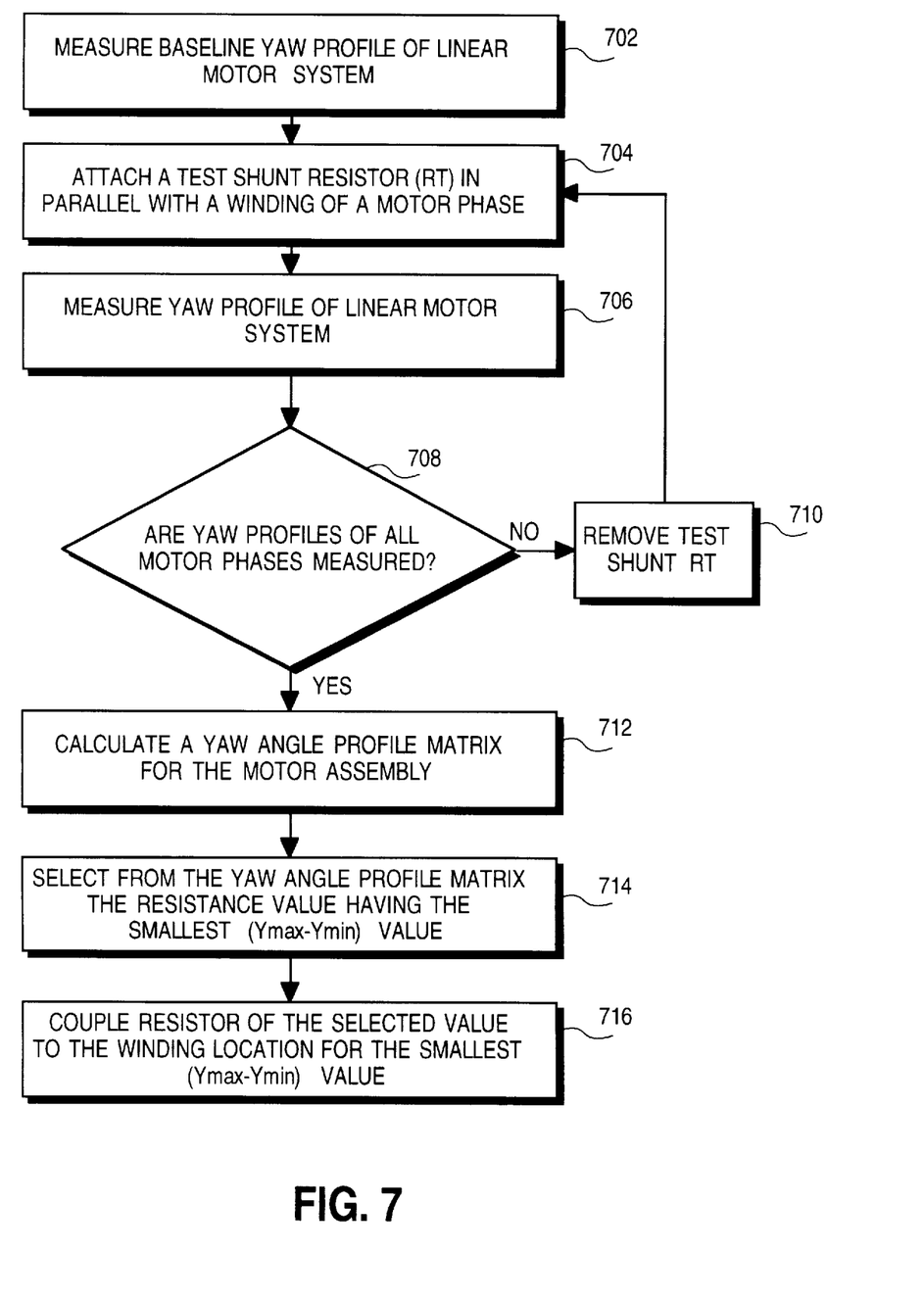
FIG. 7 is a flowchart that outlines the steps of selecting the value and location of a shunt resistor to trim a Sawyer motor, according to one embodiment of the present invention.

FIG. 7 is a flowchart that outlines the steps of selecting the value and location of a shunt resistor to trim a Sawyer motor, according to one embodiment of the present invention. In step 702, a baseline measurement yaw profile of the linear motor system is taken, as described in the discussion above. For each phase in a Sawyer motor assembly, a test shunt resistor is installed, step 704. The test shunt resistor is typically attached in parallel with a winding of a motor phase, as illustrated in FIG. 3. In one embodiment, the value of the shunt resistor is calculated as described in the discussion above using a technique in which the minimum yaw error values for the motor system are determined.

In step 706, a yaw profile is measured of a motor phase of the motor system. Typically, the first phase measured is the phase with the shunt resistor attached. Steps 704 and 706 are repeated until all yaw profiles are measured for all the motor phases of the motor system. Thus, in step 708 it is determined whether yaw profiles have been measured for all of the motor phases. If there remain phases to be measured, the shunt test resistor is removed, step 710, and the process repeats from step 704. Once the yaw angle profiles for all of the phases have been measured, the process proceeds from step 712 in which a yaw angle profile matrix for the entire motor system is calculated.

In step 714, the yaw angle profile matrix generated in step 712 is analyzed and resistance value having the smallest $Y_{max} - Y_{min}$ value is selected. In one embodiment of the present invention, the value for step 714 is selected using an equation that calculates the $Y_{wi}$ yaw error value for a matrix, where "$\epsilon$" corresponds to $Y_{wi}$ yaw error values. In one embodiment, the equation is expressed as follows:

$$\epsilon_{m,n,i,j} = \max(\emptyset_k + \omega_i \Delta\emptyset_{m,k} + \omega_j \Delta\emptyset_{n,k}) - \min(\emptyset_k + \omega_i \Delta\emptyset_{m,k} + \omega_j \Delta\emptyset_{l,k})$$

In the above equation, $\epsilon_{m,n}$ corresponds to the the yaw angle shunt locations, m corresponds to the profile of yaw angles from 1 to the number of phases, and k corresponds to the motor phase.

In step 716, a shunt resistor of the calculated value is attached to the phase identified in step 714 as having the lowest yaw error value.

Figure 9:
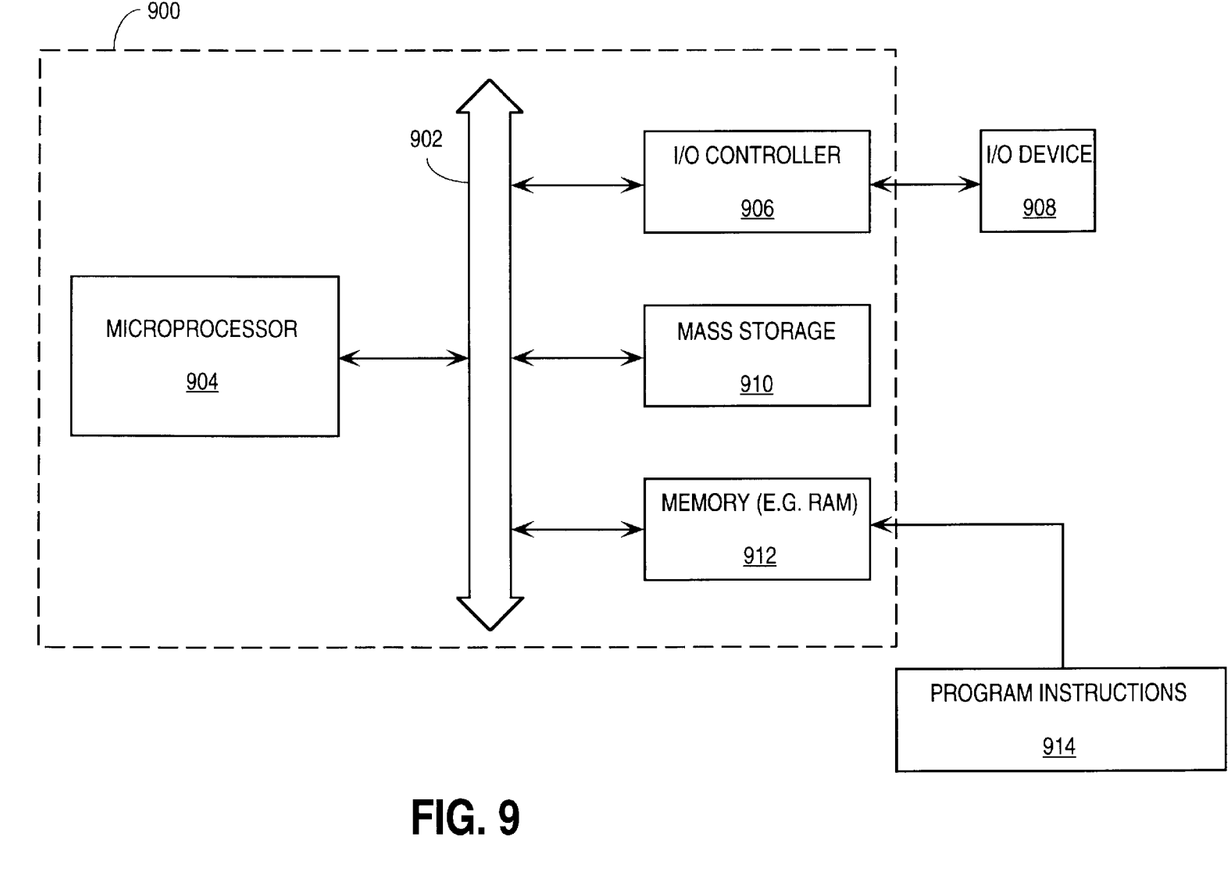
FIG. 9 is a diagram of a general purpose computer capable of implementing the steps of selecting the value and location of a shunt resistor to trim a Sawyer motor, according to one embodiment of the present invention.

FIG. 9 is a diagram of a general purpose computer capable of implementing the steps of selecting the value and location of a shunt resistor to trim a Sawyer motor, according to one embodiment of the present invention. General purpose computer 900 includes a microprocessor 904, an input/output (I/O) controller 906, mass storage 910 and memory 912, all of which are interconnected by a system bus 902. Microprocessor 904 may be any conventional microprocessor or microcontroller, although it is preferable that it is a general purpose microprocessor which is controlled under computer program instructions 914 stored in memory 912. I/O controller 906 may be a conventional input/output controller which can perform direct memory access to memory 912 and which can also communicate data to and from microprocessor 904. I/O controller 906 provides input and output control for a coupled I/O device 908, which may be a mouse, keyboard and/or display. Mass storage 910 may include conventional mass storage such as a magnetic hard disk. Memory 912 may be DRAM or flash memory or other types of storage devices. In one embodiment, computer program instructions 914 include instructions to execute the method of FIG. 7. Thus, the method of FIG. 7, as described previously, may be implemented by a general purpose computer.

In the foregoing, a system has been described for passively trimming Sawyer motors to correct for yaw errors introduced by manufacturing deviations. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus comprising:
   a linear motor system having a plurality of motors; and
   a shunt circuit coupled in parallel with a winding of a motor of said plurality of motors, said shunt circuit configured to adjust for a deviation in performance between a first motor and a second motor of said plurality of motors.

2. The apparatus of claim 1 wherein said linear motor system is a Sawyer motor system.

3. The apparatus of claim 2 wherein said deviation in performance is a translational error caused by differences in magnetic characteristics between said first motor and said second motor.

4. The apparatus of claim 1 wherein said shunt circuit is a passive resistor circuit.

5. The apparatus of claim 1 wherein said shunt circuit is an active impedance circuit.

6. The apparatus of claim 3 wherein said plurality of motors comprises a first motor and a second motor, each motor having a first phase and a second phase.

7. The apparatus of claim 6 further comprising a forcer magnetically coupled to a platen, said linear motor system operable to move said forcer across a surface of said platen in two orthogonal directions.

8. The apparatus of claim 7 wherein said forcer is operable to position a semiconductor wafer for processing in an automated semiconductor manufacturing process.

9. A method comprising the steps of:
   measuring a baseline rotational angle profile of a linear motor system;
   measuring a first rotational angle profile set of a motor of said linear motor system;
   calculating a rotational angle profile matrix for said motor,
   selecting a minimum rotational angle yaw error from said rotational angle yaw error matrix; and
   coupling a shunt in parallel with a winding of said motor, said winding corresponding to said minimal rotational yaw error.

10. The method of claim 9 wherein said step of measuring said first rotational angle profile set further comprises the steps of:
    calculating the value of a test shunt resistor;
    attaching said test shunt resistor in parallel with a winding of a first phase of said motor;
    measuring a rotational angle profile of said first phase of said motor;
    detaching said test shunt resistor from said first phase;
    attaching said test shunt resistor in parallel with a winding of a second phase of said motor;
    measuring the rotational angle profile of said second phase of said motor; and
    detaching said test shunt from said second phase.

11. A method comprising the steps of:
    measuring a baseline rotational angle profile of a linear motor system;
    measuring a first rotational angle profile set of a first motor of said linear motor system;
    measuring a second rotational angle profile set of a second motor of said linear motor system;
    calculating a first rotational angle delta matrix for said first motor,
    calculating a second rotational angle delta matrix for said second motor;
    selecting a minimum rotational delta from said first and second rotational angle delta matrix; and
    coupling a shunt in parallel with a winding corresponding to said minimal rotational delta.

12. In a general purpose computer, a method comprising the steps of:
    measuring a baseline rotational angle profile of a linear motor system;
    measuring a first rotational angle profile set of a motor of said linear motor system;
    calculating a rotational angle profile matrix for said motor,
    selecting a minimum rotational angle yaw error from said rotational angle yaw error matrix; and
    coupling a shunt in parallel with a winding of said motor, said winding corresponding to said minimal rotational yaw error.

13. The method of claim 12 wherein said step of measuring said first rotational angle profile set further comprises the steps of:
    calculating the value of a test shunt resistor;
    attaching said test shunt resistor in parallel with a winding of a first phase of said motor;
    measuring a rotational angle profile of said first phase of said motor;
    detaching said test shunt resistor from said first phase;
    attaching said test shunt resistor in parallel with a winding of a second phase of said motor;
    measuring the rotational angle profile of said second phase of said motor; and
    detaching said test shunt from said second phase.

* * * * *